US010735015B2

(12) United States Patent
Juhl

(10) Patent No.: US 10,735,015 B2
(45) Date of Patent: Aug. 4, 2020

(54) METHOD AND DEVICE FOR ANALOG-TO-DIGITAL CONVERSION, AND ELECTRICAL NETWORK

(71) Applicant: VOLKSWAGEN AKTIENGESELLSCHAFT, Wolfsburg (DE)

(72) Inventor: Jochen Juhl, Lüdersfeld (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 0 days.

(21) Appl. No.: 16/552,077

(22) Filed: Aug. 27, 2019

(65) Prior Publication Data

US 2020/0067519 A1 Feb. 27, 2020

(30) Foreign Application Priority Data

Aug. 27, 2018 (DE) .................. 10 2018 214 402

(51) Int. Cl.
*H03M 1/12* (2006.01)
*H04L 29/08* (2006.01)

(52) U.S. Cl.
CPC ........... *H03M 1/1245* (2013.01); *H04L 67/12* (2013.01)

(58) Field of Classification Search
CPC . H03M 1/1245; H03M 1/1255; H03M 1/1285
USPC .................................. 341/122, 155
See application file for complete search history.

(56) References Cited

U.S. PATENT DOCUMENTS

| 4,704,908 | A | * | 11/1987 | Blatter | ...................... G01F 1/60 73/861.17 |
| 5,815,101 | A | | 9/1998 | Fonte | |
| 7,720,648 | B2 | * | 5/2010 | Paul | ...................... H04L 25/062 327/60 |
| 9,599,713 | B2 | * | 3/2017 | Giger | ...................... G01S 17/10 |
| 9,859,708 | B2 | * | 1/2018 | Buhl | ...................... H02J 3/387 |
| 2014/0307263 | A1 | * | 10/2014 | Hatada | ............... G01B 9/02007 356/484 |

(Continued)

FOREIGN PATENT DOCUMENTS

| DE | 24 55 302 A1 | 5/1976 |
| DE | 40 19 001 A1 | 12/1991 |
| DE | 10 2007 043 927 A1 | 3/2009 |

(Continued)

OTHER PUBLICATIONS

Search report for European Patent Application No. 19 19 2873, dated Jan. 9, 2020.

*Primary Examiner* — Peguy Jean Pierre
(74) *Attorney, Agent, or Firm* — Pearl Cohen Zedek Latzer Baratz LLP

(57) ABSTRACT

The invention relates to a method for analog-to-digital conversion of an analog input signal, which is at least essentially continuous and which has a useful signal that is superimposed with at least two interference signals having different frequencies, into a digital output signal, wherein the input signal is sampled in a limited measuring cycle, and wherein the number and points in time of multiple sampling points within the measuring cycle are determined as a function of a frequency of the input signal. It is provided that the sampling points (are determined as a function of the frequencies of the interference signals.

9 Claims, 1 Drawing Sheet

(56) References Cited

U.S. PATENT DOCUMENTS

2017/0115330 A1 4/2017 Motz
2018/0122625 A1 5/2018 Grede et al.

FOREIGN PATENT DOCUMENTS

| DE | 20 2014 004 689 U1 | 10/2014 |
| DE | 10 2014 107 540 A1 | 12/2015 |
| DE | 10 2015 212 242 A1 | 1/2017 |

* cited by examiner

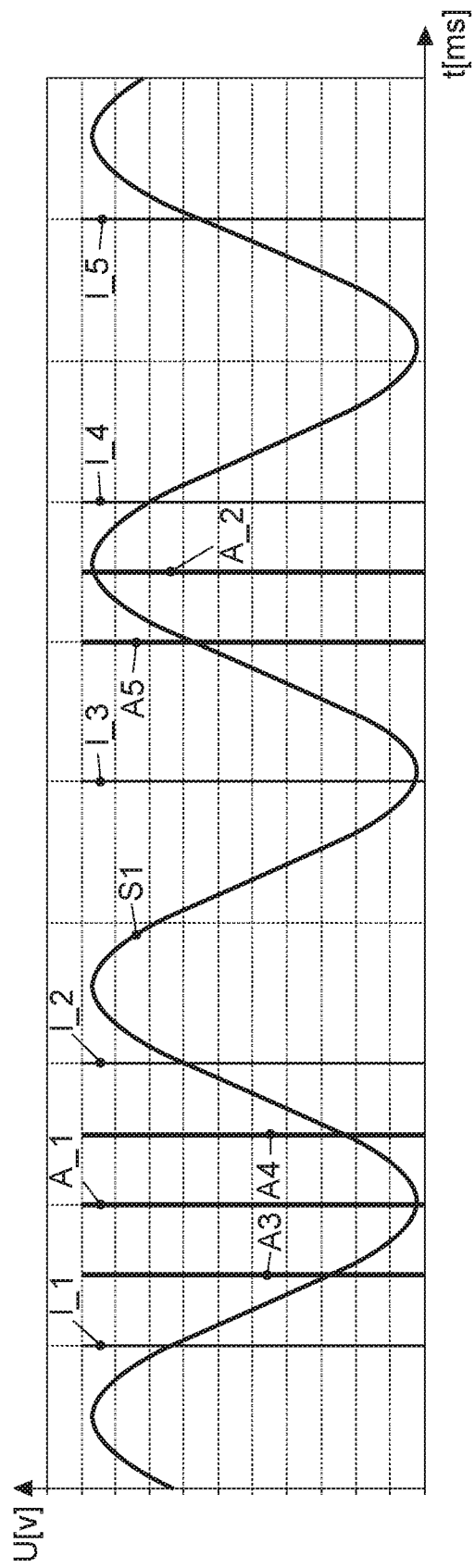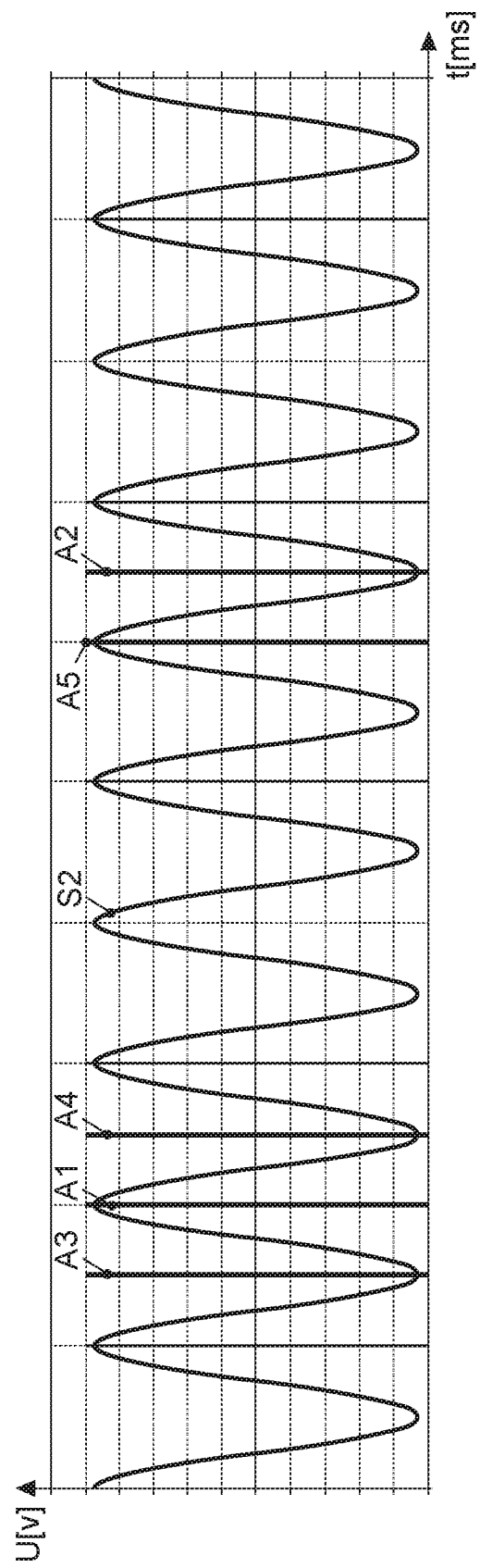

METHOD AND DEVICE FOR ANALOG-TO-DIGITAL CONVERSION, AND ELECTRICAL NETWORK

CROSS-REFERENCE TO RELATED APPLICATIONS

This application claims priority from German Patent Application No. 10 2018 214 402.8, filed Aug. 27, 2018, which is hereby incorporated by reference.

FIELD OF THE INVENTION

The invention relates to a method for analog-to-digital conversion of an analog input signal, which is at least essentially continuous and which has a useful signal that is superimposed with at least two interference signals having different frequencies, into a digital output signal, wherein the input signal is sampled in a limited measuring cycle, and wherein the number and points in time of the multiple sampling points within the measuring cycle are determined as a function of a frequency of the input signal.

The invention further relates to a device for carrying out the above method, as well as an electrical network, in particular an onboard network or traction network of a motor vehicle, having such a device.

BACKGROUND OF THE INVENTION

Methods of the above-mentioned type are known from the prior art. Thus, for example, German unexamined patent application DE 24 55 302 A1 discloses a method for analog-to-digital conversion in which an analog input signal undergoes superimposed, equidistant, at least pseudo-stochastically varied sampling intervals at a limited sampling rate. The aim is to achieve increased resolution of the analog input signal without an appreciable increase in the capital costs. It is assumed to be well known that an analog input signal is sampled taking the Shannon or Nyquist theorems into account. Accordingly, the number of samplings per measuring cycle must be greater than 2, and the number of samplings per measuring cycle is an integer, for example as summarized in German unexamined patent application DE 10 2007 043 927 A1. In the cited document, it is also proposed to determine an estimated frequency for the signal frequency, and to determine the sampling frequency as a function of the estimated frequency, and thus, ultimately from the reduced signal frequency. In addition, a method for analog-to-digital conversion is known from unexamined U.S. Pat. No. 5,815,101 A, in which the input signal is sampled with a first sampling rate and with a second sampling rate.

In practice, it has been shown that in the traction network of a motor vehicle, for example, the electrical network is superimposed with interference signals, in particular in the area of a traction battery. During monitoring of the battery cells, the battery voltage or the cell voltage is detected as the input signal. The voltage signal is frequently superimposed with two interference signals having different frequencies, so that reference is made to a high-frequency interference signal and a low-frequency interference signal.

If the signal is now sampled with equidistant sampling points in the measuring cycle, a relatively high measuring error results. The methods proposed in the above-mentioned prior art cannot reduce the measuring error to a satisfactory extent.

SUMMARY OF THE INVENTION

The object of the invention, therefore, is to provide an improved method for analog-to-digital conversion in which the measuring error is reduced to a minimum.

The object underlying the invention is achieved by the method having the features as claimed. As a result, the measuring error during the analog-to-digital conversion is easily reduced to a minimum, wherein the total number of samplings provided does not have to be increased beyond a level that has been possible thus far. According to the invention, this is achieved by determining the sampling points as a function of the frequencies of the interference signals. The sampling points are thus matched and adapted to the interference signals, so that in particular minima and maxima of the interference signals may be better detected, as the result of which the measuring error may be reduced.

According to one preferred refinement of the invention, at least two sampling points are determined as a function of the frequency of the low-frequency interference signal, and at least two sampling points are determined as a function of the frequency of the high-frequency interference signal. Thus, according to this embodiment a total of at least four sampling points are preferably specified, wherein two sampling points depend on the low-frequency signal, and two sampling points depend on the high-frequency control signal. In particular, the sampling points are determined as a function of the period duration of the particular interference signal. The measuring error is successfully reduced by using at least four sampling points, two for each of the interference signals. A further reduction of the measuring error is achieved by determining the sampling points as a function of the frequencies of the interference signals.

Four sampling points are preferably selected for a measuring cycle; i.e., a measuring period is thus limited to four sampling points, wherein a first sampling point and a second sampling point are selected at a distance from a one-half period duration and at least one whole period duration of the low-frequency interference signal. The first and the second sampling points are thus specified as a function of the low-frequency interference signal, and the distance between them corresponds at least to one and a half times the period duration, two and a half times the period duration, three and a half times the period duration, four and a half times the period duration, etc., of the low-frequency interference signal. The aim is to be able to detect a maximum and a minimum of the interference signal, as the result of which the low-frequency interference signal is advantageously taken into account for reducing measuring error.

Furthermore, it is preferably provided that the at least two sampling points selected as a function of the high-frequency interference signal are determined as a function of the first and the second sampling points. In particular, the two further sampling points are positioned around the first and the second sampling points in order to detect the high-frequency interference signal in the vicinity of maxima and minima of the low-frequency interference signal. The measuring error is further reduced in this way.

A third sampling point is particularly preferably placed at a one-half period duration of the high-frequency interference signal, before or after the first sampling point, and a fourth sampling point is placed at a one-half period duration of the high-frequency interference signal, before or after the second sampling point. The selected distances of the sampling points from one another ensures that theoretically, the maxima and minima of the high-frequency interference signal are detected, and the measuring error is thus further reduced.

According to one preferred refinement of the invention, a fifth sampling point is placed at a whole period duration from the high-frequency interference signal, before or after the third or fourth sampling point. The sampling frequency in the measuring cycle is thus increased, and the measuring error is further reduced due to an advantageous placement of the fifth sampling point.

The frequencies of the interference signals are particularly preferably determined in advance so that they are known and usable for carrying out the method.

The device according to the invention having the features of Claim 8 is characterized by a control unit that is specially adapted to carry out the method according to the invention under normal conditions of use. This results in the advantages stated above.

The electrical network according to the invention having the features of Claim 9, in particular an onboard network or traction network of a motor vehicle, is characterized by the device according to the invention. This results in the stated advantages.

BRIEF DESCRIPTION OF THE DRAWINGS

Further advantages and preferred features and feature combinations result from the above discussion and from the claims. The invention is explained in greater detail below with reference to the drawings, in which:

FIG. 1 shows a diagram for explaining an advantageous method for operating an analog-to-digital conversion.

DETAILED DESCRIPTION OF THE INVENTION

FIG. 1 shows by way of example a simplified diagram of the patterns of two interference signals S1, S2, which have different frequencies and are superimposed on a useful signal.

It is assumed that the interference signals S1 and S2 are superimposed on a useful signal, for example the voltage signal of an energy store of a motor vehicle, and together with the useful signal form the input signal to be sampled. For the sake of simplicity, the interference signals S1 and S2 are illustrated one above the other in FIG. 1. The interference signals S1 and S2 are provided as periodic, in the present case sinusoidal, signals, in particular continuous over time and having a known frequency. For this purpose, the interference signals S1 and S2 are, for example, detected or calculated in the system in advance. In the present case, the interference signal S1 has a frequency of 33 hertz, and the interference signal S2 has a frequency of 100 hertz. The interference amplitude in each case is 240 mV, and the useful signal is 3.7 V.

The input signal is sampled for the analog-to-digital conversion, wherein a maximum of four sampling points are available within a measuring window or measuring cycle. In the present case, a measuring cycle spans 100 ms, or alternatively, 80 ms. Whereas equidistant sampling points have been used in the past, characterized by five horizontal first lines I_1 through I_5 for the measuring cycle of 100 ms, and for the measuring cycle of 80 ms only four equidistant sampling points have been used, it has been shown that this results in a relatively large measuring error in the evaluation or in the analog-to-digital conversion. By simply increasing the number of sampling points it would be possible to easily reduce the measuring error in each case; however, this is possible only under certain conditions that are specified by the processing system. Thus, for example, in the traction network of a motor vehicle, detection of more than five sampling points in the stated time interval of 100 ms, or of more than four sampling points in the shorter time interval of 80 ms, of the measuring cycle is not possible.

However, to still reduce the measuring error, the advantageous method provides that the sampling points are determined as a function of the frequencies of the interference signals S1 and S2. A first sampling point A1 and a second sampling point A2 are specified as a function of the low-frequency interference signal S1. The distance between the sampling points A1 and A2 is selected as a function of the period duration or the frequency of the interference signal S1 in such a way that the distance is one-half a period and at least one whole period. This may be described as follows:

$$x_1 = \tfrac{1}{2}iT_1 + niT_1,$$

where $x_1$ is the distance between the sampling points A1 and A2, $T_1$ is the period duration of the low-frequency interference signal S1, and n is an integer (0, 1, 2, 3, 4, . . . ). As a result, for example when the sampling point A1 is at the minimum of the interference signal S1, as shown in FIG. 1, the second sampling point A2 is at a maximum.

The two remaining sampling points A3 and A4 of the total of preferably four sampling points are specified as a function of the high-frequency interference signal S2, thus, as a function of the position of the sampling points A1 and A2:

The third sampling point A3 is placed chronologically before or after (in FIG. 1, before) the first sampling point A1, in particular at a distance of a one-half period duration $T_2$ of the high-frequency interference signal S2. Thus, the distance between the sampling points A3 and A4 is a whole period duration of the interference signal S2, so that, for example, as shown in FIG. 1, they are each at the minimum of the interference signal S2.

The fourth sampling point A4 is placed at a one-half period duration $T_2$ of the interference signal S2 before the second sampling point A2. The fourth sampling point A4 is thus at a distance of a one-half period duration and multiple whole period durations $T_2$ from the sampling point A3, so that it is at a maximum when the sampling point A3 is at a minimum of the interference signal S2. This distance $x_2$ may be described as follows:

$$x_2 = \tfrac{1}{2}T_2 + nT_2,$$

where $x_2$ is the distance between the sampling points A3 and A4 of the second interference signal S2, $T_2$ is the period duration of the second interference signal S2, and n is an integer (0, 1, 2, 3, 4, 5, . . . ).

Optionally, a fifth sampling point A5 is placed at a period duration $T_2$ from the second interference signal S2, before or after the third or fourth sampling point (in the present exemplary embodiment, before). For a measuring cycle of 100 ms, five sampling points are preferably placed, and for a measuring cycle of 80 ms, only four sampling points are placed.

It has been shown that measuring error in the sampling of the interference signals S1, S2 may thus be significantly reduced. Thus, for example, the measuring error of the low-frequency signal S1 is reducible by 13 mV, and the measuring error of the high-frequency interference signal S2 is reducible by 192 mV. This results in a more accurate and reliable analog-to-digital conversion of the input signal.

In particular, this method is carried out in or by a battery cell controller that monitors the charging voltage of the battery cell. Particularly accurate detection of the charging voltage of the battery cell is thus possible. However, the method may also be used for any other application of an analog-to-digital conversion.

LIST OF REFERENCE SYMBOLS

S1 interference signal
S2 interference signal
l_1 line
l_2 line
l_3 line
l_4 line
l_5 line
A1 sampling point
A2 sampling point
A3 sampling point
A4 sampling point
A5 sampling point

The invention claimed is:

1. A method for analog-to-digital conversion of an analog input signal, which is at least essentially continuous and which has a useful signal that is superimposed with at least two interference signals having different frequencies, into a digital output signal, comprising:

sampling the input signal in a limited measuring cycle, wherein the number and points in time of multiple sampling points within the measuring cycle are determined as a function of a frequency of the input signal, wherein the sampling points are determined as a function of frequencies of the interference signals.

2. The method according to claim 1, wherein at least a first and a second sampling points are determined as a function of the frequency of the interference signal having a lower relative frequency, and at least a third and a fourth sampling points are determined as a function of the frequency of the interference signal having a higher relative frequency.

3. The method according to claim 2, wherein at least four sampling points are selected in a measuring cycle, of which the first sampling point and the second sampling point are selected at a distance from a one-half period duration and at least one whole period duration of the interference signal having the lower relative frequency.

4. The method according to claim 2, wherein the third and fourth sampling points selected as a function of the interference signal having the higher relative frequency are determined as a function of the first and second sampling points.

5. The method according to claim 2, the third sampling point is placed at a one-half period duration of the interference signal having the higher relative frequency, before or after the first sampling point, and the fourth sampling point is placed at a one-half period duration of the interference signal having the higher relative frequency, before or after the second sampling point.

6. The method according to claim 2, wherein a fifth sampling point is placed at a period duration of the interference signal having the higher relative frequency, before or after the third or fourth sampling point.

7. The method according to claim 1, wherein the frequencies of the interference signals are determined in advance.

8. A device for carrying out the method according to claim 1, comprising a control unit that is specially adapted to carry out the method according to claim 1 under normal conditions of use.

9. An electrical network for a motor vehicle, comprising a device according to claim 8.

* * * * *